United States Patent [19]

Miller

[11] Patent Number: 4,809,196

[45] Date of Patent: Feb. 28, 1989

[54] METHOD FOR DESIGNATING/SORTING SEMICONDUCTOR WAFERS ACCORDING TO PREDICTED OXYGEN PRECIPITATION BEHAVIOR

[75] Inventor: Donald A. Miller, Fishkill, N.Y.

[73] Assignee: International Business Machines Corporation, Armonk, N.Y.

[21] Appl. No.: 849,995

[22] Filed: Apr. 10, 1986

[51] Int. Cl.$^4$ .......................... G01N 21/39; G01N 7/00
[52] U.S. Cl. ............................... 364/550.01; 156/601; 436/4; 436/136
[58] Field of Search ....................... 437/8, 10, 13, 239, 437/247, 939, 976; 150/601; 436/4, 136; 364/550.01

[56] References Cited

U.S. PATENT DOCUMENTS

| | | | |
|---|---|---|---|
| 4,342,616 | 8/1982 | Elliott et al. | 156/601 |
| 4,429,047 | 1/1984 | Jastrzebski et al. | 156/601 |
| 4,637,123 | 1/1987 | Cazcarra et al. | 437/8 |

OTHER PUBLICATIONS

Curtis & Verkuil, Amer. Soc. for Testing & Materials, A High Signal-To-Noise Osillator for Contactless Measurement of Photoinduced Carrier Lifetimes.
Ogita, J. Appl. Psy. vol. 19 (1980) No. 11 Contactless Measurement of Carrier Lifetime in Semiconductor Wafers by Use of Strip Lines.
Bio-Rad Notes 101, Apr. 1983, Reprinted from J. Elec. Chem. Soc. vol. 129, No. 7 July 1982—Method to Measure the Precipitated and Total Oxygen Concentration in Silicon.
Bio-Rad Notes 101—Apr. 1983—Method to Measure the Precipitated and Total Oxygen Concentration in Silicon, By L. Jastrzebski, et al.
Bio-Rad Notes No. 102 Apr. 1983, Precise and Rapid Measurement of Interstitial Oxygen Concentration in Silicon, by Krishnan.
Bio-Rad QS-100 Autofeed/Autoscan System.
Huber, et al. Early Stages of Oxygen Precipitation in CZ Silicon, Satelite Symposium. Ele. Chem. Soc. Essderc 82-Aggregation Phenomena of Point Defects in Silicon.
Hill-Detection of Latent Scratches and Swirl on Silicon Wafers by Scanned Surface Photoresponse. J. Appl. Psy. 51(8) Aug. 1980 pp. 4115-4118.

Primary Examiner—Thomas H. Tarcza
Assistant Examiner—David Cain
Attorney, Agent, or Firm—William T. Ellis

[57] ABSTRACT

A method for marking/sorting semiconductor wafers in accordance with predicted values of oxygen precipitation in the wafers that will occur after the performance of a thermal process step. In a preferred embodiment, this oxygen precipitation prediction is obtained by means of a correlation equation $$Y = A_0 + A_1 OX_i + A_2/LT + A_3 C + A_{12} OX_i/LT + A_{13} OX_i C + A_{23} C/LT,$$

where $OX_i$ is the value of interstitial oxygen in the wafer measured prior to the thermal process step, LT is the minority carrier lifetime for the wafer measured prior to the thermal process step, and C is the initial substitutional carbon in the wafer measured prior to the thermal process step. The constants $A_0$, $A_1$, $A_2$, $A_3$, $A_{12}$, $A_{23}$, and $A_{13}$ are initialized on a first sample of wafers representative of a desired range of crystal types. In a preferred embodiment, this initialization is performed using Y values equal to the change in interstitial oxygen after the performance of the thermal process step.

This predictive method can be performed on every wafer prior to semiconductor device fabrication therein, thereby improving device yield after wafer processing.

36 Claims, 1 Drawing Sheet

METHOD FOR DESIGNATING/SORTING SEMICONDUCTOR WAFERS ACCORDING TO PREDICTED OXYGEN PRECIPITATION BEHAVIOR

BACKGROUND OF INVENTION

The present invention relates to a method for the physical designation of semiconductor wafers according to predicted oxygen precipitation behavior for a given set of thermal process steps. This method utilizes non-destructive tests on the wafer and thus can be performed on every wafer prior to semiconductor device fabrication therein.

In the mass-production of large scale integrated circuit devices, it is highly desirable to detect material deficiencies that may produce either unsatisfactory LSI devices, or low yields of satisfactory devices, prior to the initiation of any fabrication process steps. Such process steps add cost to the individual wafers, and should be minimized for any wafers ultimately destined for scrap.

It is now well known that the existence of oxygen in single crystal semiconductor wafers such as, for example, silicon wafers, has a profound effect on ultimate device yields and device characteristics in large scale integrated (LSI) electronic circuits, especially field effect and bipolar transistor digital circuits. The presence of this oxygen in the semiconductor wafers has a beneficial effect in terms of wafer hardening (solution hardening) and impurity gettering. The wafer hardening arises due to oxygen atoms located interstitially in the semiconductor lattice acting to prevent, to some degree, the semiconductor atoms from moving within their lattice. Accordingly, these oxygen atoms sitting interstitially in the lattice act to harden the lattice and prevent wafer warpage and lattice shear. The impurity gettering arises due to oxygen precipitates formed in the lattice. Essentially, these oxygen precipitates microscopically disrupt the semiconductor lattice and form a dense localized network of lattice dislocations. Metallic impurities arising in crystal growth, wafer fabrication, wafer cleaning, and/or during subsequent hot processing steps such as epitaxial deposition (800°–1200° C.), dopant drive-in (900°–1200° C.), or chemical vapor deposition (700°–1100° C.), tend to migrate to these oxygen precipitate sites where they are trapped. These oxygen precipitates are typically formed by oxygen atoms leaving the interstitial solution in the semiconductor lattice to form microscopic $SiO_2$ particles or $Si_xO_y$ complexes. They are essential to removing the metallic impurities which are added in above-listed later device processing steps and which would destroy device operation.

The major phenomena affecting oxygen precipitation behavior for a semiconductor wafer of, for example, silicon, undergoing a given defined sequence of thermal steps, are the presence of undesired contaminants, the initial oxygen concentration in the lattice solution, and the grown-in or annealed microstructure of the lattice. Accordingly, during semiconductor device manufacturing via the growing of a monocrystalline boule of suitably doped silicon, much effort has been expended in the past to limit the contaminants in the as-grown boule. Likewise, much effort has been expended to control the growth process to obtain a uniform radial and axial distribution of oxygen compatible with subsequent process and device needs. However, despite improvements in crystal growing technique, there still exist variations in individual wafers sliced from a given boule that may render any given one of the wafers unsuitable for subsequent device processing. Likewise, there are clear differences between individual boules. Such differences manifest themselves due to differences in thermal processing temperatures, heating and cooling rates, furnace configurations, spacing of wafers in boats, non-oxidizing or oxidizing ambients, the intrusion of trace contaminants, etc. These differences in process details can produce profound differences in the resulting wafers.

Accordingly, it is highly desirable to be able to test each wafer cut from a boule, before or after polish, to insure that it is suitable for the fabrication of a device thereon, and prior to performing any further device fabrication steps. This testing could then be used for either marking or sorting the wafers in order to minimize the number of cost-adding process steps performed prior to scrapping the wafers. However, at the present time there is no satisfactory method for predicting the oxygen precipitation content that will exist after the performance of a thermal process step. Current manufacturing techniques generally require the dedication for destructive test purposes of a certain number of wafers from a test lot. This wafer dedication not only precludes the use of these same wafers for device fabrication, but also places undue reliance on statistical sampling analysis. Moreover, it has been found that the use of sister wafer testing for crystals is, in many cases, inaccurate due to micro-fluctuations and along across the crystal in the various atomic concentrations and lattice structure.

A variety of studies have been performed in the art directed at oxygen precipitation content in semiconductor wafers. For example, see the study by Huber et al., Satellite Symposium, Electro Chemical Society, ESS-DERC 82, Aggregation Phenomena of Point Defects In Silicon, Munich, Sept. 17, 1982, wherein oxygen precipitation engineering in silicon is discussed. However, such studies do not adequately disclose methods of accurately predicting oxygen precipitation content of a wafer after a thermal process step.

The invention as claimed is intended to remedy the above-defined drawbacks. The invention solves the problem of how to predict oxygen precipitation content in a semiconductor wafer which exists after a given set of device processing thermal cycles have been performed. This invention further solves the problem of predicting oxygen precipitation content without damaging the wafer under test.

The advantages offered by the invention are that oxygen precipitation content in a semiconductor wafer can be predicted prior to the performance of thermal processing steps, thereby preventing the addition of cost-adding process steps to wafers which are to be scrapped. A further advantage to the present invention is that the oxygen precipitation content of the wafer is predicted by means of non-destructive tests performed on the wafer, thereby permitting the testing of every wafer. Thus, it is no longer necessary to dedicate certain wafers from a lot for test purposes, or to rely on statistical sampling analysis for wafer batches. A still further advantage of the present invention is that through the use of this oxygen precipitation prediction method, it is now possible to select wafers in accordance with predicted oxygen precipitation values for a given product/process application, to provide rapid feedback for the optimization of the device process and/or fabrication conditions (including crystal growth and subsequent thermal treatments), and to characterize wafers on an arbitrary standardized "figure of merit" oxygen precipitation scale, to facilitate sorting. These options can be exercised independently of a particular product process.

SUMMARY OF THE INVENTION

Briefly, the present invention comprises a method for the physical designation of semiconductor wafers according to predicted oxygen precipitation behavior, for a given set of thermal process steps, comprising the steps of:

measuring the initial value $OX_i$ of interstitial oxygen in the wafers in a non-destructive manner prior to performing the given set of thermal processing steps;

measuring the minority carrier lifetime values LT in the wafers in a non-destructive manner which is free of interference from surface recombination due to uncontrolled fast surface states, with the measurement being performed prior to performing the given set of device thermal processing steps;

correlating in a single correlation the $OX_i$ value and the LT value for a given wafer to obtain a value Y precipitation value for the wafer; and physically designating the wafer to indicate a particular value of Y, or a range of Y values that are suitable for an intended LSI product application.

In one embodiment, the correlating equation utilized is $$Y = A_0 + A_1 OX_i + A_2/LT,$$

where $OX_i$ is the initial value of interstitial oxygen, LT is the minority carrier lifetime, and $A_0$, $A_1$ and $A_2$ are coefficients. In a further embodiment, a cross-term between the $OX_i$ term and the LT term may be included. In yet a further embodiment, a term for an initial value of carbon in the wafer may be added along with the cross-term between the $OX_i$ term and the LT term. In a preferred embodiment, the equation will include a term for the initial carbon content in the wafer, as well as cross-terms between the $OX_i$ term and the LT term, between the $OX_i$ term and the C term, and between the LT term and the C term.

The coefficients $A_0$, $A_1$, $A_2$, etc. are to be determined by means of regression analysis. In a preferred embodiment, the multivariate least squares method of linear regression analysis is utilized to determine these coefficients.

In a preferred embodiment, the equation obtained is for a Y equal to the change in interstitial oxygen from the initial value of interstitial oxygen $OX_i$ after the performance of the set of thermal process steps.

DETAILED DESCRIPTION OF THE PREFERRED EMBODIMENT

Figure 1:
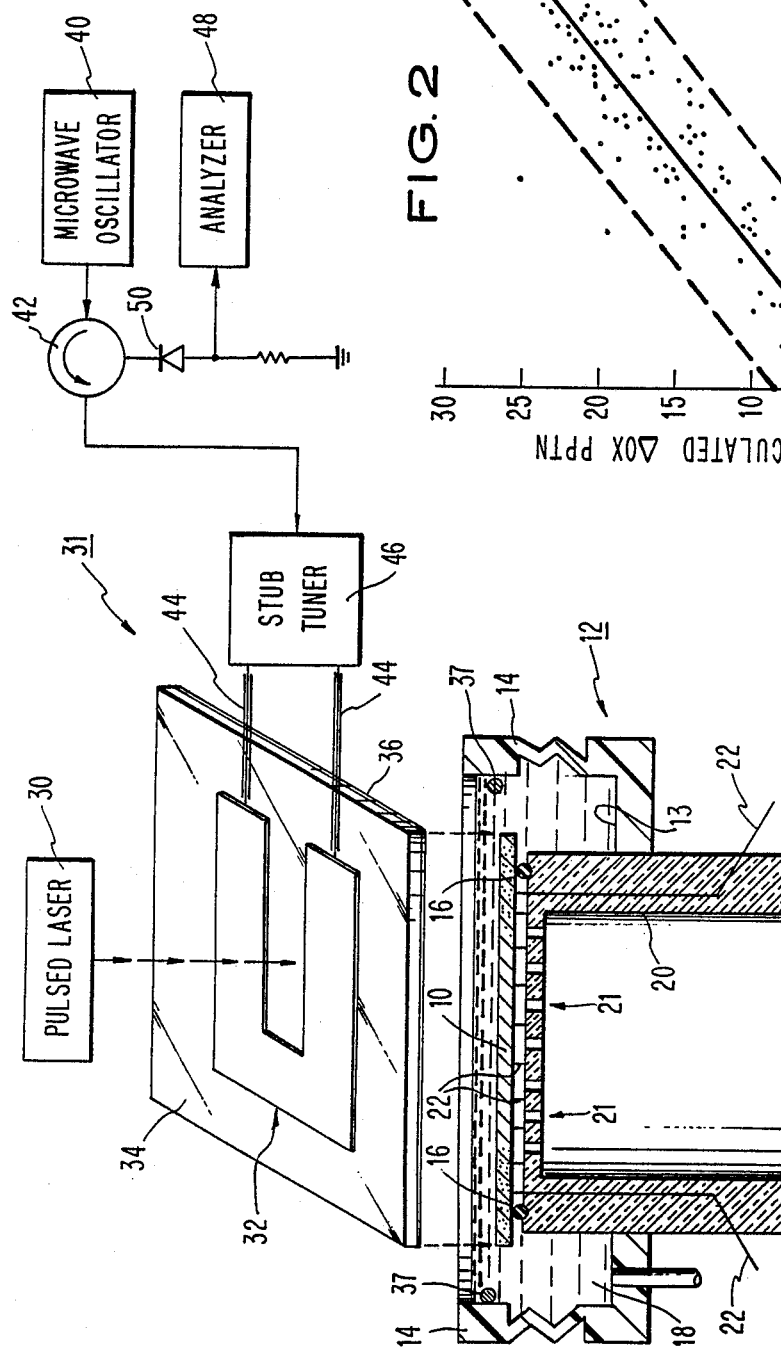
FIG. 1 is a schematic diagram of an apparatus which may be utilized to measure the minority carrier lifetime.

One method of carrying out the invention is described in detail below. This method relates to the physical designation of semiconductor wafers according to predicted oxygen precipitation behavior, for a given set of thermal process steps.

This method for predicting the oxygen precipitation behavior of a wafer after a thermal process step is based on the proportionality of the oxygen precipitation amount to both the initial interstitial oxygen content realized before the performance of the thermal process steps in question, and to the microscopic structure and content of other impurities in the wafer before the performance of the thermal process steps.

The following independent parameters are utilized in the present prediction method: the initial interstitial oxygen value, $OX_i$, for the wafer under test; the minority carrier lifetime, LT; and the initial substitutional carbon value, C, in the wafer. The initial interstitial oxygen value, $OX_i$, provides the reference or starting point for determining the change in interstitial oxygen after the performance of a thermal process step. The reciprocal of the minority carrier lifetime is utilized because it measures the degree of nucleation of the wafer lattice for oxygen precipitation, i.e., it is proportional to the density of microdefects which can act as oxygen precipitation sites. The substitutional carbon, C, value is used because carbon tends to form silicon carbide particles which constitute nucleation sites. Note however, that carbon cannot be outdiffused from the silicon surface after wafer fabrication (unlike the oxygen), and thus acts to attract contaminants which can destroy the functionality of any devices formed in the wafer surface layer.

The method comprises the first step of measuring the initial value $OX_i$ of interstitial oxygen in the wafers in a non-destructive manner prior to performing the given set of thermal processing steps. There are a variety of techniques available for taking an initial interstitial oxygen measurement. In this regard, see ASTM F121-83. However, commercially available fast fourier transform infrared (FTIR) instruments are preferred for taking interstitial oxygen measurements on thin wafer samples suitable for LSI product manufacture.

The next step is to measure the minority carrier lifetime LT in the wafers in a non-destructive manner which is free of interference from surface recombination due to uncontrolled fast surface states, with the measurement being performed prior to performing the given set of thermal processing steps for device fabrication, but after any anneals to enhance the nucleation for precipitation. In a preferred embodiment, the surface recombination may be turned off via a strong d.c. accumulation bias applied by means of a wet-cell containing an easily cleaned electrolyte connected to low voltage electrodes. The LT measurement may be obtained by means of a photoconductive decay tester which operates by measuring microwave reflectance after pulsed illumination of the wafer by a diode laser. The diode laser in this test configuration may be set behind a quartz plate bearing a slotline antenna and a transparent bias electrode. A detailed description of this apparatus for testing the minority carrier lifetime, as well as a description of the FTIR device, is provided infra.

The next step in the present method is to correlate, in a single correlation, the $OX_i$ values and the LT values for a calibration sample of wafers to Y values which are proportional to the predicted oxygen precipitation value for the series of wafers. This correlation is then used to predict precipitation on wafers of like nature.

There are a variety of methods available in the art for correlating the $OX_i$ values and the LT values for a first set of wafers in order to obtain a correlation equation for Y. In one embodiment, a first wafer set of initial oxygen values $OX_i$ and reciprocal of minority carrier lifetime values LT are correlated to Y values which, in this example, may be proportional to the change in interstitial oxygen values, $\Delta OX$, measured after the given set of thermal process steps have been performed on this first wafer set. This correlation yields an equation for Y with an $OX_i$ term and an LT term. It is preferred that some form of multi-variate regression analysis be utilized to perform this correlation. In general, multivariate regression analysis, of whatever functional form for $F(X1, X2, \ldots Sn)$, seeks to approximate the fit of Y-data to X-data, by minimizing the errors of the fit. The most common method of optimization is that of "least squares fit", or "mean-square regression", in which the individual error terms, $Y_i - F_i$, for n-sets of data are squared (to remove sign dependence), then summed, with the result minimized through optimization of the coefficients in the function F. This is also called the minimized "root mean square" error, RMS, if the square-root of the sum is taken. The function $F(X)$ can take many forms, including linear, power, exponential, Fourier, transformation of variable, etc., with the form sometimes clearly suggested by the phenomena providing the data. Among the various procedures for implementing multivariate regression analysis (one dependent variable, several independent variables to exponents of one or greater, with optional cross-terms) are those of "the general linear model" (in which multiple equations are expressable in matrix form), "the forward solution of the abbreviated Doolittle method", "the backward elimination procedure", etc.

In a preferred embodiment, multivariate regression linear analysis is utilized, both because it is the simplest in form, and also because it is suggested by the wafer physics.

For purposes of illustration only, and not by way of limitation, a discussion of the the least squares regression analysis method is provided below. For this method, with a first wafer set of N data pairs, $X_i$ and $Y_i$, where Y is the dependent variable and X is the independent variable, a function F(x) can be obtained to approximate Y with a linear fit to the data. In the simplest form, with only a single independent variable $OX_i$, the function F(x) may be equal to $F(X) = A_0 + A_1 X_i$, with the function F calculated such that the sum of the squares of the error terms $[Y(X_n) - F(X_n)]^2$, is minimized. In this equation for $F(X)$, the coefficient $A_0$ is the system offset, while the slope coefficient, $A_1$, is the coefficient for the independent variable, X. In order to determine $A_0$, the following equations are calculated for the series of n data pairs:

$$\underline{X} = (1/n)\Sigma X_i, \underline{Y} = (1/n)\Sigma Y_i,$$

where the sum sign $\Sigma$ denotes summation over the n terms. Accordingly, $A_0 = \underline{Y} - A_1 \underline{X}$, and $A_1 = (\Sigma X_i Y_i - n\underline{XY})/(\Sigma X_i^2 - \underline{X}^2)$. For this linear regression of Y on X, the scatter between Y and F can be used to calculate a correlation coefficient CC, which has a magnitude approaching unity for a good fit, and approaching 0 for a minimal relationship. For one independent variable, $$CC^2 = (n \Sigma X_i Y_i - \Sigma X_i \Sigma Y_i)^2 / (n \Sigma X_i^2 - (\Sigma X_i)^2)(n \Sigma Y_i)^2 (\Sigma Y_i)^2).$$

Y is exactly equal to X if the intercept or system offset term $A_0 = 0$, the slope or first order coefficient $A_1 = 1$, and the magnitude of $CC = 1$.

The above-described linear regression fit to the data can be extended to other relationships for F(x), such as an Nth order regression of Y on X. In the preferred embodiment, this linear regression analysis is extended to M-dimensional space, such that Y is a function of a plurality of independent variables such as the initial interstitial oxygen value $OX_i$ and the reciprocal of minority carrier lifetime LT. This type of analysis is termed multi-variate regression analysis for Y.

In order to obtain the coefficients for the equation for Y using a series of N data sets, there are a variety of software programs commercially available for both main-frame and desk-top computers. By way of example, the multi-variate regression analysis can be performed by the program "REGGY", by Dr. Jack Prins, STAT 7, in the APL Statistical Libraries. This program is one of a number of programs based on a standard text analysis of multi-variate regression of the type described in *Introduction To Multivariate Statistical Analysis*, by T. N. Anderson, Wiley, 1966; *Statistical Theory and Methodology*, by K. Brownlee, Wiley, 1965; *Introduction to Statistical Analysis*, by W. Dixon and F. Massey, McGraw-Hill, 1969; *Introduction to Theory of Statistics*, by A. Mood and F. Graybill, McGraw-Hill, 1963; and *Applied Regression Analysis*, by N. Draper and H. Smith, Wiley, 1966. The software program can be used on both a main-frame computer (IBM installed user program SH20-1841-1) and on an IBM Personal Computer. (See "The Director of Personally Developed Software for IBM Personal Computers direct from IBM"). The program will provide multi-variate regression analysis with the option of cross-terms among the various independent variables. By way of example, the typed inputs to be entered into a system using the REGGY program is set forth below.

| | |
|---|---|
| 1 | REGGY .05 |
| 2 | INPUT THE DEPENDENT VARIABLE **OX2 |
| 3 | INPUT THE INDEPENDENT VARIABLE |
| 4 | OX1 AND (1÷LT) AND CARB |
| 5 | INPUT THE DEGREE OF FIT **1 |
| 6 | TYPE 1 FOR CROSSTERMS, 0 IF NOT **1 |
| 7 | ENTER A VECTOR OF THE VARIABLES TO BE CROSSED AS FOLLOWS: |
| 8 | 1 3 TO GET X1×X3, ETC . . . TO TERMINATE CROSSING, ENTER 0 |
| 9 | ENTER VECTOR **1 2 |
| 10 | ENTER VECTOR **1 3 |
| 11 | ENTER VECTOR **2 3 |
| 12 | ENTER VECTOR **0 | where each of $OX_i$, OX2, LT, and CARB is a "vector" name for a series of N values.

It should be noted that in line 1 the right argument of REGGY is $\alpha = 0.05$ in order to provide a confidence level of at least 95% (or $1 - \alpha$).OX (PPM) in line 2 represents the interstitial oxygen measurement after the thermal process steps have been performed. The variable OX2 is the dependent variable. Note that similar analysis can be performed by defining the dependent variable as $\Delta OX = OX1 - OX2$. The independent variables in this program are listed in line 4 as OX1 (PPM) (independent variable 1), 1/LT (independent variable 2) (the minority carrier lifetime in microseconds), and CARB (PPM) (independent variable 3). Note that CARB is an additional independent variable which may be utilized to correlate the carbon content of the wafer with the oxygen precipitation. The line 5 relates to the degree of fit and has a 1 typed therein to indicate the use of first order terms only in this embodiment. If cross-terms between the independent variables are desired, then in line 6 a 1 is typed. In lines 9-11 the vectors of the variables to be crossed are listed. Accordingly, to obtain one cross-term between the variables 1 and 2, line 9 is entered as shown. Likewise, in order to obtain cross-terms between independent variables 1 and 3, line 10 is entered as shown. Finally, in order to obtain cross-terms between independent variables 2 and 3, line 11 is entered as shown.

It is acceptable statistical practice to censor a small percentage of data called "sports", defined as values for Y falling more than $\pm 2$ or 3 standard deviations from the least-squares fit, $F(X1, X2, \ldots Xn)$, since the $\pm 2$ and $\pm 3$ std. dev. limits are expected to contain, respectively, 95.49 and 99.74 percent of the statistical population. In a graphical example provided infra, censoring of the three worst data sets, less than 2.3 percent of the total sample size, caused the recalculated CC to increase from 0.89 to 0.92, and the standard deviation to decrease by 14.9 percent. (said "sports" standard deviation to decrease by 14.9 percent. (said "sports" and much of the data scatter are believed due to limitations of the prototype lifetime test apparatus used.)

Accordingly, if a sample of wafers representative of a desired range of crystal types in terms of oxygen content range, carbon content range, and microstructure type suitable for thin polished semiconductor slices for LSI product fabrication is chosen, and if the above-described measurements of the initial interstitial oxygen $OX_i$ and the minority carrier lifetime LT are made prior to the performance of the thermal process step or steps, and then the interstitial oxygen is measured again for each wafer after the thermal process steps have been performed, then a correlation equation for Y can be obtained as described above. This equation for Y will be calibrated for the particular thermal cycle under test, which can emulate product fabrication or else "benchmark" standardized conditions.

After this calibration procedure, the equation for Y is ready for use in predicting the oxygen precipitation content of the crystal types used for the initialization. Accordingly, each wafer to be tested has a measurement of its initial value $OX_i$ of interstitial oxygen performed in approximately the same manner as in the initialization step and prior to performing the given set of thermal processing steps on the wafer. Additionally, the minority carrier lifetime LT for the wafer is measured in approximately the same manner as in the initialization step and prior to performing the given set of thermal processing steps on the wafer. Finally, a value Y indicative of the predicted oxygen precipitation value for the wafer is determined using the previously initialized equation for Y. Then, each wafer is physically designated to indicate a particular value of Y or a range of Y values.

In a further embodiment, in order to obtain a greater correlation coefficient CC, a linear series equation for Y is utilized with an $OX_i$ term, a 1/LT term, and a cross-term therebetween.

In a preferred embodiment, the step of correlating to obtain the linear series equation for Y comprises the step of correlating the $OX_i$ and the 1/LT values to Y values. However, in this embodiment the Y values are equal to the interstitial oxygen values $OX_f$ measured after the performance of the set of thermal processing steps subtracted from the initial interstitial oxygen values $OX_i$, to thereby obtain an equation for Y which predicts the change in the interstitial oxygen from the initial values of oxygen $OX_i$ after the performance of the set of thermal process steps.

In wafers where the carbon content of the wafer is not de minimus, a step is included of measuring the initial value C of substitutional carbon in the wafers in a non-destructive manner prior to performing the given set of thermal processing steps. (In this regard, see ASTM F123-83. Commercially available FTIR instruments are preferred for taking substitutional carbon measurements on thin wafer samples suitable for LSI product manufacture.) The correlating step then comprises the step of correlating the first set of initial interstitial oxygen values $OX_i$ and the reciprocal of minority carrier lifetime values LT and the initial carbon values C to values proportional to the interstitial oxygen $OX_f$ measured after the given set of thermal processing steps have been performed in order to obtain the linear series equation for Y. This linear series equation for Y thus has an $OX_i$ term, a 1/LT term, and a C term for the measured initial carbon value.

In yet a further embodiment of the present method, the step of correlating to obtain a the linear series equation for Y includes an $OX_i$ term, a 1/LT term, a C term, and one or more cross-terms between these independent variables. From experiment, it appears that the cross-term between the $OX_i$ term and the 1/LT term is most preferred in terms of yielding an optimum correlation. Additional cross-terms between the $OX_i$ term and the C term, and between the 1/LT term and the C term, may be added to further improve the CC correlation value.

In view of the above, a most preferred version of the correlation equation indicative of the oxygen precipitation in a given wafer is set forth below:

$$Y = \Delta OX = A_0 + A_1 OX_i + A_2/LT + A_3 C + A_{12} OX_i /LT + A_{13} OX_i C + A_{23} C/LT$$

Note that the terms $A_0$, $A_1$, $A_2$, $A_3$, $A_{12}$, $A_{13}$, and $A_{23}$ are all coefficient constants which are determined during the initialization of the equation for Y. It should be noted that only linear terms are utilized in the equation, although other higher order terms may be added as desired. It may also be desirable to add a triple cross term $A_{123}$. However, a correlation coefficient exceeding 0.9 was achieved with the preferred equation set forth above.

With the above-described preferred equation, it is possible to predict the oxygen precipitation in a given wafer, and then either physically mark that wafer in accordance with its predicted oxygen precipitation value, or sort that wafer in accordance with its predicted oxygen precipitation value.

PREFERRED EMBODIMENT

The present method will be demonstrated utilizing boron-doped silicon single-crystal ingots grown by means of the Czochralski pulling method with automatic control, as described in U.S. Pat. No. 3,493,770. The wafers resulting from this standard crystal-growing process are typically on the order of 300 to 700 microns in thickness.

The first step in implementing the resent method for the physical designation of semiconductor wafers according to predicted oxygen precipitation behavior is to initialize the equation for Y on a representative first sample set of wafers which cover a desired range of crystal types in terms of oxygen content range, carbon content range, and microstructure. In the present example, 132 wafers from 8 crystals representing 3 distinct crystal growth processes were utilized for the initialization. These wafers were obtained by means of standard Czochralski puller-model systems. A standard 650° C. "oxygen-donor anneal" was performed in ingot form before ingot slicing. Then chem-thinning, and two-sided polishing steps were performed on the wafers. The wafers in this first wafer sample were then measured for initial interstitial oxygen values, initial carbon, and initial minority carrier lifetime. This first wafer sample was then separated into two groups, each having similar distributions in $OX_i$, LT, and C, and one of these two wafer groups was subjected to a 750° C. anneal in nitrogen for four hours to "pre-nucleate" these wafers. All wafers were then cleaned and treated by means of a two-sided brush cleaner fed with a solution of ammonium hydroxide and followed by water rinse. The wafers were then retested for interstitial oxygen content and minority carrier lifetime. It was found that the interstitial oxygen readings made after this pre-nucleation agreed to within a few tenths ppm with the interstitial oxygen reading made before the pre-nucleation. However, it is known that such a pre-nucleation anneal can obscure the carbon readings. Accordingly, carbon readings must be taken prior to any pre-nucleation anneal step. Comparison of the minority carrier lifetime readings showed that pre-nucleating lowered the mean carrier lifetime reading by approximately 93.5%. Accordingly, LT measurements should be made after any pre-nucleation heating steps.

The interstitial oxygen measurements listed above may be taken by a fast fourier transform infrared instrument (FTIR). Such an instrument can accurately measure oxygen and carbon concentrations on thin semiconductor wafers suitable for LSI product manufacture and in a manner suitable for subsequent device processing of those wafers.

The use of FTIR devices is well known in the art. By way of example, see the application notes from BIO-RAD:Note 102, "Precise and Rapid Measurement of Interstitial Oxygen Concentration in Silicon", by K. Krishnan; and Note 101, "Method to Measure the Precipitated and Total Oxygen Concentration in Silicon", by Jastrzebski, Zanzucchi, Thebault, and Lagowski, reprinted from the Journal of the Electro Chemical Society, 129(7), July 1982. The use of the FTIR method permits a resolution of well below one part per million atomic (ppma) for both oxygen and carbon, on wafers below 0.5 mm in thickness. Note that the FTIR measurement instrument accomplishes a non-destructive measurement on finished wafers. Such FTIR measurements are most accurate for stress-free surfaces and plane-parallel two-side polish. However, correction terms can be added for one-side polished or chem-thinned surfaces.

There are a variety of techniques which may be utilized in order to measure the minority carrier lifetime. It should be noted, though, that it appears to be imperative to exclude interference from surface recombination of the minority carriers during such a measurement. Such surface recombination exclusion may be accomplished, by way of example, by strongly accumulating with majority carriers or inverting with minority carriers the semiconductor surface by means of a d.c. bias voltage. Note that accumulation is preferred to inversion, so as to have no induced carrier-depleted region below the surface. In applying such a bias to the wafer surface, the wafer surface must not be damaged. A preferred method for applying this d.c. bias without surface destruction of the wafer is by means of an electrolyte wet-cell. See, for example, the electrolytic wet-cell disclosed in U.S. Pat. No. 4,125,440. An electrolyte for the cell should be chosen that can be easily cleaned after the lifetime test and either (a) suppresses anodic oxidation, or (b) deliberately anodizes a few tens of angstroms of the wafer surface after which the voltage can be reduced. By way of example, electrolytes with an anion which is difficult to oxidize and with a cation which is difficult to reduce such as tetramethylammonium tetrafluoroborate, or 1% ammonium sulfate may be utilized.

Further examples include very dilute solutions (on the order of several percent) of semiconductor grade acids, excluding those which could remove any oxidized silicon layers and/or are hazardous to equipment or operators. For example, several percent of hydrochloric acid in semiconductor grade high purity water could be used.

Note that most or all suitable acqueous electrolytes and some suitable water-miscible organics, such as alcohols, glycols, etc., can easily be removed after test by standard cleaning methods which are compatible with subsequent product fabrication. Note also that any extra cleaning steps required due to the use of this electrolyte bath can generally be left to the front-end cleaning step performed in a standard LSI device line.

This wet-cell bias arrangement for suppressing surface recombination may be combined with a photoconductive-decay lifetime apparatus of the type which utilizes, for example, microwave energy. A preferred minority carrier testing apparatus may be based on the measurement of the microwave reflectance from a wafer surface which has been irradiated by a laser pulse.

A minority carrier lifetime apparatus for carrying out the present minority carrier lifetime measurement is shown in FIG. 1. A polished wafer 10 to be lifetime tested is disposed in a wet-cell 12, comprised of a tank 13 having cylindrical or rectangular movable and/or compressible walls 14 and filled with an electrolyte 18. The polished wafer 10 is disposed on the top of a cylindrical vacuum pedestal 20, including vacuum ports 21, and 20, shown in cross-section in the figure. The inner portion of vacuum pedestal 20 should be of quartz or other tough glass, of low dielectric constant and no conductivity, to be transparent to incident photons and microwave radiation.

Electrical contact is made to the bottom surface of the polished wafer 10 by means of a ring of deformable or spring-loaded electrodes 22 inside the radius of an O-ring seal 16 which separates the electrodes 22 from the electrolyte 18. Generally the voltage applied to the deformable electrodes 22 is a ground voltage. Preferably, this electrical contact via the electrodes 22 is outside of the area to be measured for minority carrier lifetime and is separated from the wafer area directly contacting the electrolyte. The other electrode required for the application of the bias voltage will be discussed below.

The photoconductive-decay-lifetime measuring apparatus may be comprised of an electrically-switchable source of photons 30 for generating electron-hole carrier pairs in the wafer 10, and a microwave sending-/receiving circuit 31 for radiating mircowaves toward the wafer 10 and then measuring the microwave reflectance therefrom. In FIG. 1, the photon source 30 comprises a laser diode 30 disposed directly above the top surface of the polished wafer 10 to be measured. The microwave sending/receiving circuit 31 may comprise a microwave sending/receiving antenna 32 of the type disclosed in the reference by Y. Ogita, "Contactless Measurement of Carrier Lifetime in Semiconductor Wafers by Use of Strip Lines", JPN. J. APL. Physics, 19(11) 1980. More specifically, the antenna 32 may comprise a microwave slotline stripline 32 disposed on a substrate 34. The slotline 32 is formed in the shape of a rectangular U and is disposed above the wafer 10 in such a manner that the laser diode 30 may inject its light radiation through the center space in the U. Accordingly, the substrate 34 must be transparent to the laser diode light radiation and must have a sufficiently low dielectric constant to allow leakage of the microwave radiation from the slotline.

In a preferred embodiment, the transparent plate 34 may be formed by a plate of quartz or other tough glass with the slotline 32 disposed on the top surface thereof. In order to apply the d.c. bias to the electrolyte 18, a transparent electrode 36 may be disposed on the bottom surface of the transparent substrate 34. A bias voltage may be applied to this bottom transparent electrode via an electrical line (not shown).

This transparent upper electrode 36 in the electrolyte wet-cell biasing arrangement may be formed simply by disposing a high resistance very thin coating of, for example, tin-oxide or gold, on the underside of the transparent substrate 34 which holds the microwave slot/line 32 on its upper surface. Such an electrode coating is essentially transparent to photons and to electromagnetic radiation. The use of this underside coating as the upper electrode in the biasing arrangement permits the precise control of the electrolyte solution thickness between the wafer 10 and the microwave slotline antenna 32. Additionally, this transparent substrate in contact with the electrolyte permits control of the meniscus effects in the microwave properties of the electrolyte solution and minimizes the microwave absorption by the solution if high frequency microwave radiation is utilized. In the alternative, this upper bias electrode may be implemented simply by disposing a circular wire electrode 37 around the inner wall 14 of the wet cell and under the surface of the electrolyte 18, as shown in FIG. 1. The slotline antenna 32 is then free to move separately. Note that it is possible to provide the transparent substrate 34 with a gradual upward curvature away from the center point, to thereby increase the clearance of the slotline antenna 32 from the edges of the wet-cell boundaries.

The microwave apparatus to be utilized with the slotline antenna 32 comprises a microwave oscillator 40, a circulator 42 connected to receive a microwave signal from the oscillator 40, a microwave line 44 with a tuner-/attenuator 46 connecting the circulator 42 to the slot line antenna 32, and an analyser 48 connected through a diode 50 to the circulator 42. The analyser 48 may simply be an oscilloscope, preferably digital. The microwave line 44 can be a waveguide of coaxial, stripline, or slotline type for efficient coupling to the sender/- receiver 32, as per S. B. Cohn, IEEE-MTT-17, No. 10, October, 1969, and Cohn et al, ibid, No. 12, December 1969.

The apparatus shown in FIG. 1 may be coupled to the above-described FTIR apparatus by means of a computer controlled handler of the type well known in the art. The electrolyte wet-cell 13 may be formed simply by having the walls 14 and 16 rise up into the track, or the wafer pedestal 20 move downward with respect to wall 14, or, in the alternative, the wafer may be picked up and deposited in the electrolyte cell by means of a robot arm. The electrolyte solution 18 is then added to submerge the wafer 10. Note that the wafer 10 is positioned so that one of its 22 surfaces is in electrical contact with the spring-loaded electrodes, inside O-ring seal 16, which forms one electrode-polarity for the biasing apparatus. The microwave transmitter/receiver apparatus including the slotline antenna 32 disposed on the transparent substrate 34 and the laser diode 30 may then be moved to a position over the wafer 10. As noted previously, the rectangular U shaped slot line antenna 32 is disposed over the wafer 10 in such a manner as to permit the light from the laser diode 30 to propagate through the space between the rectangular U of the antenna 32 and down onto the top surface of the wafer 10. The transparent substrate 34/antenna 32 combination is then lowered such that the electrode formed on the bottom surface of the substrate 34 is in contact with the surface of the electrolyte 18. Accordingly, the electrodes 22 and the coated bottom surface 36 of the transparent substrate 34 (or the alternative electrode 37) form the electrodes which provide the bias voltage to suppress surface-state recombination. The bias voltage applied in order to effect the desired d.c. voltage biasing of the top surface of the wafer 10 is typically on the order of 1 to 10 volts. (See D. E. Hill, J. Appl. Phys. 51, No. 8, August 1980.) It should be noted that it may be desirable to provide the capability for moving the laser diode 30-slotline antenna 32 configuration laterally to permit measurement of the minority carrier lifetime in a multiplicity of locations on the surface of the wafer 10.

In operation, with the wafer 10 properly biased in the wet-cell 13, microwave radiation in a preferred frequency range of 1 to 10 $GH_3$ or higher (using commercially available components) is directed from the slotline antenna 32 to the wafer 10. However, because the wafer 10 is made from a semiconductor material, this microwave radiation propagates, with little or no reflection, through the wafer. When the laser 30 is pulsed, light photons at the appropriate frequency are directed to the surface of the wafer 10. These photons create electron-hole pairs in the surface layer of the wafer. Microwaves impinging on this wafer surface, with its upper layer filled with electron-hole pairs, penetrate only a skin depth into the wafer's surface before being reflected by this layer of electron-hole charges. These reflected microwaves are received by the slotline antenna 32. The slotline antenna 32 converts this microwave radiation into an electrical signal which is fed via the line 44, the circulator 42, and the diode 50, to the signal analyzer 48. This microwave reflection from the wafer surface layer continues until the electron-hole pairs formed by the laser photons recombine, thereby providing a measurement of minority carrier lifetime.

The lifetime apparatus actually employed in the feasibility demonstration (a) used 2 to 10 percent sodium chloride in water, (b) operated with radio wave energy of 150 megahertz, (c) had a vertical-slot wet cell which was conducive to damage of the wafer surfaces, and (d) used very low d.c. bias (well below 0.1 V "to suppress film growth"), so that the apparent lifetime values were extremely sensitive to the type of wafer cleaning which preceded the test. A brush-clean with ammonium hydroxide solution and water rinse was used and was found to leave surface ions which worked with the applied d.c. voltage to produce adequate accumulation on P-type silicon wafers. It was essential to remove all salt residues before a wafer dried, to prevent corrosion and strongly adhering films on the wafer The prototype apparatus also lacked resolution at low lifetimes, because it used a slow rise and fall xenon flash instead of a fast response laser diode. Also, note that the use of microwave energy, rather than radio wave energy (10 GHz vs. 150 MHz) produces greater sensitivity on thin wafers, because of the decreased depth of penetration of the electromagnetic energy into the light injected charge charriers. More specifically, since the skin depth penetration of electromagnetic radiation into a good conductor varies approximately as the reciprocal of the square root of the frequency, for a high injected carrier concentration, an apparatus operated at 10 GHz is more than 8 times as sensitive as the actual 150 MHz frequency used.

The actual apparatus utilized to obtain minority carrier lifetime measurements for the present example formed the antenna 32 by means of a marginal oscillator employing a tank coil with eddy current loading and set to operate at 150 MHZ. This apparatus was similar to that described in the reference by Verkuil and Curtis, "A High Signal-to-Noise Oscillator For Contactless Measurement of Photoinduced Carrier Lifetimes", ASTM Special Technical Publication 712, 1980.

Because the electrolyte utilized to obtain the data for this example was dilute sodium chloride, the wafers were rinsed and cleaned prior to the performance of the thermal process step. Since the feasibility lifetime apparatus used very low d.c. bias, it was found necessary to precede the lifetime test with double-brush and dilute ammonia. This contrasts with the preferred embodiment, wherein the pre-test clean may be optional and wherein the post-test wafer clean comprises the steps of draining the wet-cell 12, and blowing off the wafer 10 with filtered nitrogen, and then automatically transporting the wafer through a double-side brush cleaner, which is flushed with appropriate cleaning agents. In the alternative, the wafer 20 could be sent to an automated single-wafer cleaning apparatus of the type made by the FSI Corporation which utilizes a standardized mechanical interface in which semiconductor-grade cleaning solutions can be applied.

It should be noted that it is preferred to have temperature control on the order of 1° C. to obtain repeatable and accurate lifetime measurements. It should also be noted that this minority carrier lifetime technique, if it utilizes a fast rise-time and fall-time light pulse, permits a resolution of minority carrier lifetimes below 1 microsecond (fast precipitating wafers) and upper lifetime limits of several orders of magnitude longer.

It should also be noted that the microwave slotline antenna disclosed in FIG. 1 is not the only form of transducer which may be utilized. For example, an open rectangular waveguide, or a co-ax antenna, or miniature dipoles may be utilized to implement the transducer 32. However, the slotline antenna is advantageous in that it is not critically sensitive to the distance between the transducer 32 and the sample wafer 10 under test, yet it offers tight lateral resolutions, further delimited by the laser spot size. It should also be noted that there are potentially various other non-wet-cell means for applying the d.c. bias to the wafer or for screening surface recombination without d.c. bias.

At this point, a measurement of the interstitial oxygen value $OX_i$ and the minority carrier lifetime value LT, and, if desired, the initial carbon value C, have been obtained for each wafer in the first wafer set to be used in the initialization. Now these wafers in this first wafer set are processed with the given set of thermal process steps. In the present experiment, the wafers were to be utilized for a bipolar LSI process line. Accordingly, various thermal process steps were simulated by applying the actual process step temperature, but without the actual process step being performed, i.e., no actual film deposition or photolithography was performed. In the present experiment, a thermal process step simulation was obtained by placing wafers in a suitable furnace under an inert gas, such as nitrogen, at a series of temperatures from 825°–1105° C. for about seven hours total time at high temperatures.

The data reported below for the present example is for end-of-process oxygen decreases, i.e., the change in oxygen, $\Delta OX$, from its initial interstitial oxygen reading, $OX_i$ to its final interstitial oxygen reading $OX_f$ after performance of the thermal process steps. In order to obtain this change in interstitial oxygen, $\Delta OX$, the initialization step for the equation for Y wherein $OX_i$ and LT and possibly C values are correlated for a first sample set of wafers, are correlated to a set of Y values equal to the interstitial oxygen values, $OX_f$, measured after the performance of the set of thermal processing steps subtracted from their initial oxygen values $OX_i$. It is, of course, understood that a correlation could be obtained for the final value of the interstitial oxygen, $OX_f$, measured after the performance of the thermal process step simply by utilizing final interstitial oxygen measurement values, $OX_f$, during the initialization procedure.

It should be noted that since FET products tend to have fewer process steps than bipolar products, the present experiment and correlation demonstrates the feasibility for the most general case of LSI applications. It should also be noted that the measurements in the present experiment were taken primarily from the wafer centers, with occasional samples measured along one or more radii. Clearly, automated embodiments of the present invention could easily measure at a multiplicity of locations per wafer.

In the initial analysis which led to the present invention, the relative influences of the different parameters on the Y value (in this instance $\Delta OX$) were obtained by performing a series of simple linear regressions and comparing the resulting values of CC for each different independent parameter.

It should be noted that the numerical values to follow are provided only for purposes of illustration. The exact values of the independent variable coefficients can change with changes in wafer growing apparatus, thermal cycles, or extreme changes in crystal type, as well as with use of better lifetime apparatus than the prototype. However, the present correlation method will operate if (a) interferences from surface effects are controlled in the measurement of LT, (b) the interstitial oxygen is measured before significant precipitation is allowed to occur at high temperature processes (e.g., much above 800° C.) which would cause loss from solution of some significant fraction of the oxygen, in the form of precipitates not detected at the 9 micrometer line, and (c) provided that the carbon, if it is to be measured, is measured is measured before masking thermal treatments are performed.

Referring now to Table I, there is shown an attempted correlation between the change in oxygen $\Delta OX$ versus $1/LT$ for 1 PPM groupings of measurements of initial interstitial oxygen values obtained for the first wafer sample set of 132 wafers. In this table, the first column represents the initial oxygen range for the initial value $OX_1$ in PPM, the second column lists the number of samples in that $OX_i$ range,

TABLE I

| $\Delta OX$ vs. 1/L.T. FOR 1 PPM OXYGEN GROUPS | | | | |
|---|---|---|---|---|
| $OX_i$-RANGE PPM | SAM-PLE | CORR. COEF. | INTERCEPT AO | SLOPE A2 |
| under 25 | 12 | .8118 | 1.2388 | 150.5098 |
| 25 to 26 | 11 | .8956 | 2.5214 | 98.3379 |
| 26 to 27 | 15 | .8446 | 5.2783 | 80.6267 |
| 27 to 28 | 15 | .7631 | 8.24921 | 80.1154 |
| 28 to 29 | 14 | .7157 | 11.1590 | 58.2848 |
| 29 to 30 | 19 | .3394 | 14.2110 | 26.9463 |
| [omit 2] | [17] | [.5503] | [13.9906] | [42.2445] |
| 30 to 31 | 23 | .047 | 20.5661 | −2.9022 |
| over 31 | 23 | .0176 | 22.7175 | −1.5510 | the third column lists the correlation coefficient CC between the measured values of $\Delta Ox$ and $1/LT$, the fourth column lists the calculated intercepts $A_o$ for a projected correlation equation of $\Delta OX = A_o + A_2/LT$. The fifth column represents the slope or coefficient $A_2$ for this proposed correlation equation.

It should be noted that the samples listed include both the "raw" and pre-nucleated wafers therein. Examination of Table I clearly shows a decrease in CC for very low (below 25 PPM) initial oxygen values $OX_i$ and for high oxygen values of $OX_i$. This is consistent with the concept that very high levels of oxygen drive precipitation due to the super saturation above equilibrium concentration, for the furnace temperature, whereas very low concentrations of oxygen have a decreased tendency to precipitate. At this point, an attempt was made to obtain a linear fit of the intercept coefficient $A_o$ and the slope coefficient $A_2$ over this range of initial oxygen $OX_i$ groupings. This attempted linear fit resulted in the equation $A_o = -79.3514 + 3.2176$ ($OX_i$) and $A_2 = 645.7953 - 20.8750$ ($OX_i$). It was found that the correlation coefficient CC for the intercept coefficient $A_o$ was CC = 0.9873, while the correlation coefficient CC for the slope coefficient $A_2$ was CC = 0.9733. These high correlation coefficients for this linear fit of the intercept coefficient $A_0$ and the slope coefficient $A_2$ were unexpected. The unusually high correlation coefficients for $A_0$ and $A_2$ suggested that a multi-variate regression analysis was possible on the present wafer sample data. Accordingly, a multi-variate regression analysis was performed on the present wafer sample data beginning with an attempted correlation between the initial oxygen measurement $OX_i$ and the minority carrier lifetime measurement LT. This multi-variate regression analysis was then extended, one independent parameter at a time, to add cross-terms, and initial carbon values C.

TABLE II

MULTIVARIATE CORRELATION OF $\Delta OX$/ PRECIPITATED OXYGEN
X1 = INITIAL-$OX_i$(PPM); X2 = 1/LT($\mu$s);
X3 = Initial-Carbon(PPM)

| C.C. | $A_o$ | $A_1$ | $A_2$ | $A_3$ | $A_{12}$ | $A_{13}$ | $A_{23}$ |
|---|---|---|---|---|---|---|---|
| #1: | All wafers, X1 and X2, no cross-terms | | | | | | |
| .829 | −44.8257 | 2.0118 | 43.9844 | OMIT | OMIT | OMIT | OMIT |
| #2: | All wafers, X1 and X2, cross-term $A_{12}$ | | | | | | |
| .850 | −57.7855 | 2.4594 | 366.3253 | OMIT | −11.2302 | OMIT | OMIT |
| #3: | All wafers, X1 and X3, no cross-terms | | | | | | |
| .803 | −30.4326 | 1.7013 | OMIT | −3.1922 | OMIT | OMIT | OMIT |
| #4: | All wafers, X1 and X3, cross-term $A_{13}$ | | | | | | |
| .814 | −51.5783 | 2.4353 | OMIT | 18.4267 | OMIT | −.7661 | OMIT |
| #5: | All wafers, X1, X2, X3 with cross-terms $A_{12}$, $A_{13}$, $A_{23}$ | | | | | | |
| .895 | −64.8452 | 2.8420 | 257.8245 | 18.1608 | −8.1435 | −.7877 | 20.8722 |
| #6: | Omit 2 wafers, X1, X2, X3 with cross-terms $A_{12}$, $A_{13}$, $A_{23}$ | | | | | | |
| .906 | −63.9378 | 2.8081 | 245.7547 | 17.3571 | −7.5872 | −.7589 | 20.5071 |

Table II shows this multi-variate correlation for the change in interstitial oxygen, $\Delta OX$. It should be noted that in this table as well as in Table I, the initial and final interstitial oxygen readings, $OX_i$ and $OX_f$ were in PPM, and the LT measurements were in microseconds, and the initial carbon readings were in PPM. Referring now to Table II, the first column represents the correlation coefficient CC; the second column is the offset coefficient, $A_o$; the third column is the coefficient, $A_1$, for the initial oxygen value, $OX_i$, the fourth column is the coefficient, $A_2$, for the reciprocal of minority carrier lifetime value $1/LT$, the fifth column is the coefficient, $A_3$, for the initial carbon measurement C; the sixth column is the coefficient, $A_{12}$, for the cross-term between the initial oxygen measurement OX and the reciprocal of the minority carrier lifetime measurement, $1/LT$; the seventh column represents the coefficient $A_{13}$ for the cross-term between the initial oxygen value, $OX_i$, and the initial carbon reading, C; and finally, the eighth column is the coefficient $A_{23}$ for the cross-term between the reciprocal of the minority carrier lifetime measurement, $1/LT$, and the initial carbon reading, C.

The first row in Table II represents a correlation between the change in interstitial oxygen, $\Delta OX$, and the initial oxygen measurement, $OX_i$, and the reciprocal of the minority carrier lifetime measurement $1/LT$, i.e., $\Delta OX = A_o + A_1 OX_i + A_2/LT$. It can be seen that there is a correlation coefficient of 0.829 for this correlation equation for $\Delta Ox$. Row #2 represents a correlation between the change in interstitial oxygen, $\Delta OX$, and the initial interstitial oxygen value, $OX_i$, and the reciprocal of the minority carrier lifetime measurement $1/LT$, and includes a cross-term, $A_{12}$, therebetween, i.e., $\Delta Ox = A_o + A_1 OX_i + A_2/LT + A_{12} OX_i/LT$. A correlation coefficient CC for this correlation equation is 0.850. Row #3 is a correlation between the change in interstitial oxygen, $\Delta OX$, and the initial oxygen value, $OX_i$, and the initial carbon value, C, with no cross-terms, i.e., $\Delta OX = A_o + A_1 OX_i + A_3 C$. It should be noted that carbon is typically present in the semiconductor wafers due to graphite heaters, shields, or other parts of the crystal pulling furnace, unless special measures are used to flush this out by streaming inert gas and proper flow design. Also, carbon can enter with the starting polycrystalline semiconductor charge. If the carbon content of the wafer is low, i.e., below detection limits or below about 0.1 ppm, then the use of carbon measurement values in the correlation is probably not necessary. It can be seen that for this first wafer set the correlation coefficient obtained for this equation is 0.803.

Row #4 for Table II is a correlation between the change in interstitial oxygen, $\Delta OX$, and the initial oxygen value, $OX_i$, and the initial carbon value, C, with a cross-term, $A_{13}$, therebetween, i.e., $\Delta OX = A_o + A_1 OX_i + A_3 C + A_{13} OX_i C$. The correlation coefficient CC for this correlation equation is 0.814. Row #5 is a correlation of the change in the interstitial oxygen value, $\Delta OX$, with the initial oxygen reading, $OX_i$, the reciprocal of the minority carrier lifetime $1/LT$, and the initial value of carbon, C, with cross-terms $A_{12}$, $A_{13}$, and $A_{23}$. It can be seen that a correlation coefficient CC of 0.895 was realized.

A comparison of rows #1 and #3 shows that row #1 gives a higher correlation coefficient than row #3, indicating that the reciprocal of the minority carrier lifetime, $1/LT$, has a stronger influence than the initial carbon, C, on the change in interstitial oxygen, $\Delta OX$, after performance of the thermal process step. Note again that this change in interstitial oxygen, $\Delta OX$, is essentially equal to the oxygen precipitation in the wafer. It can also be seen that row #2 has a CC value which is greater than row #1, indicating that the $A_{12}$ cross-term provides an improvement in correlation. A comparison of row #4 to row #3, which relate to the correlation of the initial oxygen value, $OX_i$, and the initial carbon reading, C, also shows an improvement with the addition of a cross-term. Row #5 shows a very high correlation on the order of 0.9 for the independent parameters of initial oxygen, $OX_i$, the reciprocal of the minority carrier lifetime, $1/LT$, the initial carbon value, C, and the cross-terms, $A_{12}$, $A_{13}$ and $A_{23}$. Accordingly, this correlation equation for Y is the preferred correlation equation. Even better correlation is expected to result from the use of more accurate lifetime measuring apparatus.

Figure 2:
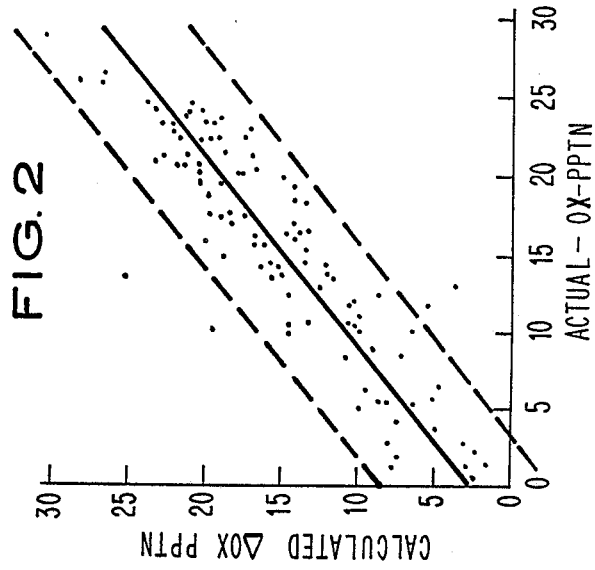
FIG. 2 is a graph of the predicted oxygen precipitation vs. measured values of the change in interstitial oxygen $\Delta Ox = OX_i - OX_f$.

FIG. 2 shows the actual data points for the calculated $\Delta OX$ values versus the actual measured $\Delta OX$ values, for the 132 wafers utilizing the correlation equation set forth for row #5, namely $$\Delta Ox = A_o + A_1 OX_i + A_2/LT + A_3 C + A_{12} OX_i/LT + A_{13} OX_i C + A_{23} C/LT.$$

It can be seen that for normal distributions, 95.44% of the sample lies within ±2 standard deviations of the mean, i.e., ±2 standard deviations of the fit of $\Delta Ox$ to the independent parameters. Likewise, three standard deviations includes 99.74% of the sample.

It should be noted that the graph of FIG. 2 of the calculated versus the actual $\Delta OX$ includes three values (2.3% of the 132 total) which are aberrations or "sports", as they lie well outside the 3 standard deviation limits. If these three values are omitted, the correlation coefficient CC increases to 0.9225, and the standard error of the estimate decreases to 2.4 (from 2.82). Accordingly the new ±2 standard deviation limits contain all but 5 of the 129 wafers (96.12%), with no wafers falling outside the new three standard deviation limits.

Row #6 in Table 2 shows this correlation omitting two of these three aberrant wafers.

From the above, it can be seen that there are a variety of correlation equations which may be utilized, with the equations described for Rows #1, 2 and 5 being the most preferred. Note that since carbon is less influential than minority carrier lifetime in enhancing oxygen precipitation, and since carbon is fixed in the crystal at crystal growth, it is probably desirable to reduce carbon wafer content to below detection levels. With very low content carbon wafers, the equation for row #2 may be the most preferred, i.e., $Y = A_o + A_1 OX_i + A_2/LT + A_{12} OX_i/LT$.

With the properly initialized correlation equation as described above, every wafer can now be non-destructively tested for its initial oxygen content $OX_i$, its minority carrier lifetime value, LT, and its initial carbon value, C, if appropriate, and then a predicted Y value, proportional to the precipitated oxygen in the wafer, obtained. This Y value could then be laser-written in terms of a unique alpha-numeric identifier, on each wafer. This alpha-numeric identifier for the predicted oxygen precipitation could also be stored in a computerized data base which could subsequently be used to correlate LSI product yields and device characteristics to the initial wafer parameters of initial oxygen, $OX_i$, initial carbon, C, and the reciprocal of minority carrier lifetime value $1/LT$. This predicted oxygen precipitation value Y can also be utilized for sorting the wafers in accordance with predetermined threshold Y values. In this regard, automated FTIR equipment such as ["autofeed/auto-scan"] the BIO-RAD QS-100 system could be set to sort in accordance with ranges of Y values, provided suitable lifetime apparatus were attached.

It is again noted that the particular values of the independent parameter coefficients in the equation for Y depend on the particular thermal cycles being used, and the resolution-accuracy of the particular measurement apparati used for measuring $OX_i$, $OX_f$, LT, and C.

In the present example, the change in interstitial oxygen, $\Delta OX$, which is proportional to or equal to the precipitation amount, agreed with the actual measured values to a correlation coefficient of on the order of 0.9 or better, despite the presence of data scatter caused by the available lifetime apparatus used in the experiment. Such data scatter is expected to be minimized if the prototype minority carrier lifetime measurement apparatus used in this example is modified by utilizing a higher wafer biasing voltage in the wet-cell 13 of on the order of 1 to 10 volts to control the surface state effects by utilizing a higher operating frequency of 1 to 10 GHz or higher to obtain more sensitivity on thin wafers, and by utilizing a faster rise-time and full-time light source such as a laser as compared to a flash tube. These device parameter changes should provide excellent resolution at lifetime below 1–10 microseconds, as well as for higher lifetime values.

It should be noted that other forms of the present algorithms set forth above may be utilized, provided that the basic independent parameters $OX_i$ and $1/LT$ are utilized in the algorithm. For example, the algorithm or equation could incorporate the parameter of time, and/or the oxygen diffusion coefficient for the relevant process temperatures. Clearly, this equation need not be limited to the linear terms set forth, e.g., the equation might also include exponentials, etc., where such terms have been established by the physics involved.

With reference to the apparatus which may be utilized in order to carry out the present method, the most sensitive means for measuring interstitial oxygen and substitutional carbon is by means of the fast fourier transform infrared apparatus (FTIR). However, it is contemplated that other alternative apparatus will be available in the future.

Likewise, the most sensitive apparatus for measuring the minority carrier lifetime in a non-destructive manner on thin finished wafers is presently by some variation of a microwave reflectance photoconductive decay apparatus, with the light source and microwave sender/received antenna at vertical incidence and on the same side of the wafer, preferably the device side of the wafer, so as to minimize back-surface effects. This minority carrier lifetime apparatus should control the surface-state recombination with either strong inversion or strong accumulation, the later being preferred in order to eliminate the added depletion layer beneath the silicon surface. The preferred wet-cell electrolyte biasing arrangement for effecting this accumulation should utilize a readily cleanable solution. Additionally, it may be desirable that the wet-cell 13 have an automated metered pumping apparatus to fill, empty and temperature-control the dilute aqueous dielectric solution or other electrolyte. The actual wet-cell walls 14 (FIG. 1) can be of polytetrafluoroethylyne, polycarbonate, polysteyrene, or other material which is compatible with the electrolyte solutions to be used. Flexible bellows-seals may be added to either the wet-cell wall 14 or to the wafer pedestal 20 to permit wafer handling by air-track apparatus without front-side contact. Such equipment permits the positioning of the wafer on the pedestal 20 such that the pedestal can then be surrounded by the wet-cell wall 14, and the electrolyte solution. Note that in such an apparatus, either the pedestal 20 can be raised and/or lowered, or the cell wall 14 can rise up into the track. The apparatus may also include a simple multi-port vacuum chuck in combination with a vacuum system that is equipped with appropriate fluid diversion in case of leakage (e.g., a drain-valved fluid trap below the height of the vacuum connection).

As noted previously, the microwave reflectance apparatus can be used to take minority carrier lifetime readings in the wafer center, and can also be controlled via a microcomputer, by way of example, with digitally controlled positioners, to test at various locations in the wafer. These various locations could be referenced to alignment flats or notches at the wafer perimeter. Note that it may also be desirable to utilize low intensity flooding of white light onto the wafer 10 in order to minimize trapping effects, as per ASTM-F28. Such low intensity white light flooding could be provided by a ring of low power lamps. Because of the vertical incidence of the microwave source and the vertical incidence of the response signals, shielding of the test apparatus may not be necessary, provided that the separation of the microwave slotline antenna 32 and the wafer 10 is small. However, such shielding can be added in the form of a metal or a metal-coated enclosure, if desired.

The above-described invention discloses a method for predicting oxygen precipitation behavior in semiconductor wafers such as silicon for a given set of device processing thermal steps.

This method can be used to (a) select wafers for a given product/process application, (b) to provide rapid feedback for the optimization of the device process and/or wafer fabrication conditions (including crystal growth and subsequent thermal treatments), and (c) to characterize wafers on on an arbitrary standardized "benchwork" or "figure of merit" scale, which can be used independently of the particular product process. The present method can be automated so as to permit an oxygen precipitation value to be determined for every wafer cut from a boule, rather than relying on statistical inferences from "sister" wafers. Accordingly, this method is a means of obtaining high wafer yield without significant crystal cropping and for optimizing the crystal growth to a given product application.

Obviously, there are many modifications and variations of the present invention which are possible in light of the above teachings. It is therefore to be understood that within the scope of the appended claims, the invention may be practiced otherwise than as specifically described.

I claim:

1. A method for designation of semiconductor wafers according to predicted oxygen precipitation behavior, for a given set of thermal process steps, comprising the steps of:

measuring a value $OX_i$ of interstitial oxygen in a given wafer in a non-destructive manner prior to performing said given set of thermal processing steps;

measuring the minority carrier lifetime values LT in said given wafer in a non-destructive manner which is free of interference from surface recombination due to uncontrolled fast surface states, with said measurement being performing prior to performing said given set of thermal process steps;

determining a predicted oxygen precipitation value Y for said given wafer from said $OX_i$ value and said LT value for said given wafer; and physically designating said wafer to indicate a particular value of Y or a range of Y values that are suitable for an intended LSI product application.

2. A method as defined in claim 1, wherein said determining step comprises the steps of:

correlating a first set of initial oxygen values $OX_i$ and minority carrier lifetime values LT measured on a first set of wafers which are representative of a desired range of crystal types, to a first set of Y values which are proportional to interstitial oxygen values $OX_f$ measured on said first wafer set after said given set of thermal process steps have been performed, to obtain a linear series equation for Y with an $OX_i$ term and an LT term; and determining the values Y from said linear series equation for a second set of initial oxygen values $OX_i$ and minority carrier lifetime values LT measured on a second set of wafers for use in physically designating said second set of wafers.

3. A method as defined in claim 2, wherein said first set correlating step comprises the step of obtaining coefficients for said $OX_i$ and LT terms in said linear series equation using the least squares method.

4. A method as defined in claim 3, wherein said correlating step comprises the step of correlating to obtain said linear series equation for Y with an $OX_i$ term, an LT term, and a cross term therebetween.

5. A method as defined in claim 4, wherein said step of correlating to obtain said linear series equation for Y comprises the step of correlating said $OX_i$ and LT values from said first wafer set to Y values from said first wafer set equal to interstitial oxygen values of $OX_f$ measured after the performance of said set of thermal processing steps subtracted from said initial oxygen values, $OX_i$, to thereby obtain an equation where Y is equal to the change in interstitial oxygen from said initial value of oxygen $OX_i$ after performance of said set of thermal process steps.

6. A method as defined in claim 5, wherein said steps are performed on thick silicon wafers in a thickness range of 300–800 microns.

7. A method as defined in claim 6, wherein said designating step comprises the step of sorting said second set of wafers in accordance with said values of Y determined for said second set of wafers.

8. A method as defined in claim 2, further comprising the step of measuring the initial value C of carbon in said wafers in a non-destructive manner prior to performing said given set of thermal processing steps; and wherein said correlating step comprises the step of correlating said first set of initial oxygen values $OX_i$ and minority carrier lifetime values LT and said initial carbon values C from said first set of wafers to said interstitial oxygen values, $OX_f$, from said first set of wafers measured after said given set of thermal process steps have been performed, to obtain said linear series equation for Y with an $OX_i$ term, and LT term, and a C term.

9. A method a defined in claim 8, wherein said correlating step comprises the step of correlating to obtain said linear series equation for Y with an $OX_i$ term, and LT term, a C term, and a cross-term between said $OX_i$ term and said LT term.

10. A method as defined in claim 9, wherein said step of correlating comprises the step of correlating to obtain said linear series equation for Y with an $OX_i$ term, and LT term, a C term, a cross-term between said $OX_i$ term and said LT term, and at least one cross-term including C.

11. A method as defined in claim 10, wherein said step of correlating to obtain said linear series equation for Y comprises the step of correlating said $OX_i$ and LT values from said first set of wafers to Y values from said first set of wafers equal to interstitial oxygen values, $OX_f$, measured after the performance of said set of thermal processing steps subtracted from said initial oxygen value $OX_i$, to thereby obtain an equation where Y is equal to the change in interstitial oxygen from said initial value of oxygen $OX_i$ after performance of said set of thermal process steps.

12. A method as defined in claim 11, wherein said steps are performed on 300–700 micron thick silicon wafers with a thickness range of 300–800 microns.

13. A method as defined in claim 12, wherein said designating step comprises the step of sorting said second set of wafers in accordance with their values of Y.

14. A method as defined in claim 1, wherein said designating step comprises the step of sorting said wafers in accordance with their values of Y.

15. A method as defined in claim 2, wherein said designating step comprises the step of sorting said second set of wafers in accordance with their values of Y.

16. A method as defined in claim 13, wherein said correlating step to obtain a linear series equation for Y comprises correlating using the least squares method.

17. A method as defined in claim 12, wherein said step of measuring the initial value $OX_i$ of interstitial oxygen comprises the step of measuring said value $OX_i$ with an FTIR apparatus.

18. A method as defined in claim 17, wherein said step of measuring said minority carrier lifetime LT comprises the steps of:

disposing said wafer in an electrolyte wet-cell;

applying a voltage bias to one surface of a wafer via said electrolyte wet-cell in order to suppress surface state recombination on said one surface;

directing a pulse of photons on to said one wafer surface with energies sufficient to form electron-hole pairs in said wafer near said one surface;

directing electromagnetic radiation on to said one wafer surface; and measuring the reflectance of said directed electromagnetic energy from said one wafer surface to obtain a value proportional to said minority carrier lifetime.

19. A method for designation of semiconductor wafers according to predicted oxygen precipitation behavior for a given set of thermal process steps, comprising the steps of:

initializing on a first sample of wafers representative of a range of crystal types in terms of oxygen content range, carbon content range, and microstructure type which are suitable for thin semiconductor wafer slices for LSI product fabrication, by (a) measuring a value $OX_i$ of interstitial oxygen in each wafer in said first wafer sample in a non-destructive manner prior to performing said given set of thermal process steps, (b) measuring minority carrier lifetime LT in each wafer in said first wafer sample in a non-destructive manner which is free of interference from surface recombination due to uncontrolled fast surface states, with said measurement being performed prior to performing said given set of thermal process steps, (c) performing said given set of thermal process steps or a simulation thereof on said wafers, (d) measuring an interstitial value $OX_f$ for each of said wafers after performance of said given set of thermal process steps, (e) for an equation $$Y = A_0 + A_1 OX_i + A_2/LT,$$

where $OX_i$ is the initial value of interstitial oxygen measured in (a), LT is the minority carrier lifetime measured in (b), Y is proportional to said measured oxygen interstitial value after said thermal process steps, and $A_o$, $A_1$, and $A_2$, are constants, determining $A_o$, $A_1$, and $A_2$, by means of multi-variate linear regression analysis;

after initialization of $A_o$, $A_1$, and $A_2$, for said range of crystal types, then for each semiconductor wafer to be physically designated, measuring the initial value $OX_i$ of interstitial oxygen in said each wafer in approximately the same manner as in said initialization step (a) and prior to performing said given set of thermal processing steps on said each wafer;

measuring the minority carrier lifetime LT in said each wafer in approximately the same manner as in said initialization step (b) and prior to performing said given set of thermal process steps on said each wafer;

determining a value Y indicative of a predicted oxygen precipitation value for said wafer using said previously defined equation $Y=A_o+A_1OX_i+A_2/LT$, using the previously initialized values for $A_o$, $A_1$, and $A_2$;

physically designating said each wafer to indicate a particular value of Y or a range of Y values.

20. A method as defined in claim 19, wherein said $A_o$, $A_1$, and $A_2$, constant determining step comprises the step of obtaining said constants by using the least squares method.

21. A method as defined in claim 20, wherein said initialization step initializes for the equation $Y=A_o+A_1OX_i+A_2/LT+A_{12}·OX_i/LT$ and determines a value for the constant $A_{12}$ by means of multi-variate linear regression analysis, and wherein said Y determining step utilizes said equation for Y including the term $A_{12}OX_i/LT$ to determine a value Y indicative of a predicted oxygen precipitation value.

22. A method as defined in claim 20, further comprising the step of measuring the initial value C of carbon in said each wafer in a non-destructive manner prior to performing said given set of thermal processing steps; and wherein said equation for Y in initialization step (e) includes a term $A_3C$ for said initial carbon value and wherein said $A_o$, $A_1$, and $A_2$ constant determining step includes the step of determining a value for the constant $A_3$ by means of multi-variate linear regression analysis, and wherein said Y determining step utilizes the equation $Y=A_o+A_1OX_i+A_2/LT+A_3C$ to determine a value indicative of a predicted oxygen precipitation value.

23. A method as defined in claim 22, wherein said equation for Y in initialization step (e) has a C cross term including a coefficient times C; and wherein said $A_o$, $A_1$, $A_2$, and $A_3$ constant determining step includes the step of determining a value for the coefficient of said C cross term by means of multi-variate linear regression analysis; and wherein said Y determining step utilizes the equation $Y=A_o+A_1OX_i+A_2/LT+A_3C+C$ cross-term, to determine a value Y indicative of a predicted oxygen precipitation value.

24. A method as defined in claim 21, further comprising the step of measuring the initial value C of carbon in said each wafer in a non-destructive manner prior to performing said given set of thermal processing steps; and wherein said equation for Y in initialization step (e) includes a term $A_3C$ for said initial carbon value and wherein said $A_o$, $A_1$ and $A_2$ constant determining step includes the step of determining a value for the constant $A_3$ by means of multi-variate linear regression analysis, and wherein said Y determining step utilizes the equation $Y=A_o+A_1OX_i+A_2/LT+A_3C$ to determine a value indicative of a predicted oxygen precipitation value.

25. A method as defined in claim 24, wherein said equation for Y in initialization step (e) has a C cross-term including a coefficient times C; and wherein said $A_o$, $A_1$, $A_2$, and $A_3$ constant determining step includes the step of determining a value for the coefficient of said C cross-term by means of multi-variate linear regression analysis; and wherein said Y determining step utilizes the equation $Y=A_o+A_1OX_i+A_2/LT+A_3C+C$ cross-term, to determine a value Y indicative of a predicted oxygen precipitation value.

26. A method as defined in claim 25, wherein said steps are performed on a silicon wafer with a thickness on the order of range of 300–700 or more microns.

27. A method as defined in claim 26, wherein said designating step comprises the step of sorting said each wafer in accordance with said values of Y.

28. A method as defined in claim 19, wherein said designating step comprises the step of sorting said each wafer in accordance with said values of Y.

29. A method as defined in claim 21, wherein said designating step comprises the step of sorting said each wafer in accordance with said values of Y.

30. A method as defined in claim 24, wherein said equation for Y in initiation step (e) includes the cross terms $A_{13}OX_iC$ and $A_{23}C/LT$; and wherein said $A_o$, $A_1$, $A_2$, $A_{12}$, and $A_3$ constant determining step includes the step of determining values for said $A_{13}$ and $A_{23}$ constants by means of multi-variate regression analysis; and wherein said Y determining step utilizes the equation $Y=A_o+A_1OX_i+A_2/LT+A_3C+A_{12}OX_i/LT+A_{13}OX_iC+A_{23}C/LT$ to determine a value of Y indicative of a predicted oxygen precipitation value.

31. A method as defined in claim 30, wherein said constant determining step comprises the step of correlating said $OX_i$ and LT values of said first sample of wafers to Y values equal to said interstitial oxygen values $OX_f$ of said first sample of wafers measured after the performance of said set of thermal process steps subtracted from said initial oxygen values $OX_i$, to thereby obtain an equation for Y which is equal to the predicted change $\Delta OX$ in interstitial oxygen contents in said wafer after the performance of said thermal process steps.

32. A method as defined in claim 21, wherein said constant determining step comprises the step of correlating said $OX_i$ and LT values of said first sample of wafers to Y values equal to said interstitial oxygen values $OX_f$ of said first sample of wafers measured after the performance of said set of thermal process steps subtracted from said initial oxygen values $OX_i$, to thereby obtain an equation for Y which is equal to the predicted change in $\Delta Ox$ interstitial oxygen contents in said wafer after the performance of said thermal process steps.

33. A method as defined in claim 21, wherein said steps of measuring the values $OX_i$ and $OX_f$ of interstitial oxygen comprises the step of measuring with an FTIR apparatus.

34. A method as defined in claim 30, wherein said steps of measuring said minority carrier lifetime LT comprises the steps of:

disposing said wafer in an electrolyte wet-cell;

applying a voltage bias to one surface of said wafer via said electrolyte wet-cell in order to suppress surface state recombination on said one surface of said wafer;

directing a pulse of photons on to said one wafer surface with energies sufficient to form electron-hole pairs in said wafer near said one surface;

directing electromagnetic radiation on to said one wafer surface; and measuring the reflectance of said directed electromagnetic energy from said one wafer surface to obtain a value proportional to said minority carrier lifetime.

35. A method as defined in claim 31, wherein said steps of measuring the values $OX_i$ and $OX_f$ of interstitial oxygen comprises the step of measuring with an FTIR apparatus.

36. A method as defined in claim 35, wherein said steps of measuring said minority carrier lifetime LT comprises the steps of:
 disposing said wafer in an electrolyte wet-cell;
 applying a voltage bias to one surface of said wafer via said electrolyte wet-cell in order to suppress surface state recombination on said one surface of said wafer;
 directing a pulse of photons on to said one wafer surface with energies sufficient to form electron-hole pairs in said wafer near said one surface;
 directing electromagnetic radiation on to said wafer one surface; and
 measuring the reflectance of said directed electromagnetic energy from said one wafer surface to obtain a value proportional to said minority carrier lifetime.

* * * * *